(12) United States Patent
Kobayashi

(10) Patent No.: US 6,499,334 B1
(45) Date of Patent: Dec. 31, 2002

(54) VARIABLE DELAY ELEMENT TEST CIRCUIT

(75) Inventor: Norifumi Kobayashi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 275 days.

(21) Appl. No.: 09/667,101

(22) Filed: Sep. 21, 2000

(30) Foreign Application Priority Data

Sep. 22, 1999 (JP) .......................... 11-268352

(51) Int. Cl.[7] .............................. G01R 33/28

(52) U.S. Cl. ...................................... 73/1.42

(58) Field of Search .................... 73/1.42; 324/617, 324/618; 327/270, 276; 714/733

(56) References Cited

U.S. PATENT DOCUMENTS

| | | | | |
|---|---|---|---|---|
| 4,604,588 A | * | 8/1986 | Webler et al. | |
| 5,811,655 A | | 9/1998 | Hashimoto et al. | .......... 73/1.42 |
| 5,923,676 A | * | 7/1999 | Sunter et al. | |

* cited by examiner

*Primary Examiner*—Robert Raevis
(74) *Attorney, Agent, or Firm*—Foley & Lardner

(57) ABSTRACT

A loop circuit including a variable delay element whose delay time amount can be set arbitrarily is formed, a loop control circuit controls so that the positive/negative logic of input pulse signal to the variable delay element is always constant, the number of output of output pulse signal of the variable delay element is counted, agreement of that count value and a predetermined set value is detected, an agreement detection signal is generated when the agreement is detected, and the transmission of output pulse signal of the variable delay element to the following circuits is controlled based on this agreement detection signal.

11 Claims, 6 Drawing Sheets

VARIABLE DELAY ELEMENT TEST CIRCUIT

CROSS-REFERENCE TO RELATED APPLICATIONS

This application is based upon and claims the benefit of priority from the prior Japanese Patent Application No. 11-268352, filed Sep. 22, 1999, the entire contents of which are incorporated herein by reference.

BACKGROUND OF THE INVENTION

The present invention relates to a variable delay element test circuit. Further, the present invention relates to a test circuit used for measuring variable delay element delay characteristics, during the success or failure decision made after product shipping inspection, reception inspection or system integration of variable delay elements.

Now, the prior art for measuring delay characteristics of variable delay elements used for various measuring instruments such as pulse generator and LSI tester timing generation section, or timing adjustment circuit in an LSI shall be described typically below.

A first prior art is a method for searching for variation points of "H" edge or "L" edge of a signal delayed by a delay time corresponding to a control signal by a variable delay element to be measured, using a reference signal at the side of measuring instrument, for instance, LSI tester or individual measuring instrument, and finding edge boundaries.

A second prior art is a technique used generally for evaluating AC characteristics of an LSI and is a method for constituting a ring oscillator in a way to contain a variable delay element to be measured, measuring by frequency measuring instrument the ring oscillator oscillation frequency before and after the variation of delay amount of the variable delay element, and determining the delay amount from the variation of oscillation frequency.

A third prior art is a technique using phase difference/voltage conversion and is a method for integrating a pulse signal corresponding to the phase difference between a signal to be measured that has passed through the variable delay element and the reference signal, converting into voltage and A/D converting this voltage value to determine the delay amount.

Now, inconveniences of these prior arts will be described below.

The first prior art requires an LSI tester having high performance or individual measuring instrument, and the running cost of measuring environment becomes expensive, because, if there is a plurality of variable delay elements, it is necessary to test each delay element one by one. Moreover, it is necessary to exchange data between the measurement system and the control system, because it is necessary to control the timing of reference signal used for search by a control system using a CPU or the like, when edge boundary is to be detected during the search of signal "H" edge, "L", edge variation points, thus requiring a considerable processing time.

In the second prior art, given the circuit restriction of the ring oscillator, it is necessary to measure the duty ratio, when a test is to be performed with respect to either one of rising or dropping of a signal output from the ring oscillator, thus requiring special circuits or measuring instruments. In addition, as in the aforementioned first prior art, it is necessary to exchange data between the measurement system and the control system, thus requiring a considerable processing time.

In the third prior art, settling time is necessary for the A/D conversion of integrated voltage value, thus requiring a considerable processing time as in previous two examples. Moreover, it is necessary to adapt the aforementioned integrated voltage value to the voltage range of the A/D converter.

This third prior art is certainly more effective than the aforementioned two examples; however, error will occur due to jitter generated in the signal transmission system or A/D converter or to the measurement system characteristics, when the delay variation amount of the variable delay element is minute. Besides, the reproducibility of measurement data can not be assured.

As described above, the conventional variable delay element test circuit of the method constituting ring oscillator including the variable delay element to be measured requires special circuits or measuring instruments when a test is to be performed with respect to either one of rising or dropping of ring oscillator signal, and it is necessary to exchange data between the measurement system and the control system, thus requiring a considerable processing time.

BRIEF SUMMARY OF THE INVENTION

Therefore, an object of the present invention is to provide a variable delay element test circuit for measuring with high accuracy a fine delay time variation amount, event when the delay time variation amount of the variable delay element is extremely small and, allowing to decide success or failure of variable delay element rapidly with a high precision.

According to a first aspect of the present invention, there is provided a variable delay element test circuit comprising a variable delay element having an input node and an output node, a delay time amount to output by delaying an input pulse signal input to the input node being set arbitrarily; a loop control circuit having a loop circuit, the variable delay element being included in this loop circuit, for controlling so that the positive/negative logic of the input pulse signal input to the input node of the variable delay element is always constant; a count control circuit for receiving an output pulse signal output from the output node of the variable delay element, counting the number of receptions of this output pulse signal, detecting agreement of that count value and a predetermined set value, and for generating an agreement detection signal when the agreement is detected; and an output control circuit connected to the count control circuit, for controlling the transmission of the output pulse signal output from the variable delay element to following circuits of the variable delay element, based on the agreement detection signal-generated by the count control circuit.

According to a second aspect of the present invention, there is provided a variable delay element test circuit comprising a first variable delay element having an input node and an output node, a delay time amount to output by delaying a first input pulse signal input to the input node being set arbitrarily; a loop, control circuit having a loop circuit, the first variable delay element being included in this loop circuit, for controlling so that the positive/negative logic of the first input pulse signal input to the input node of the first variable delay element is always constant; a count control circuit for receiving an output pulse signal output from the output node of the first variable delay element, counting the number of receptions of this output pulse signal, detecting agreement of that count value and a predetermined set value, and for generating an agreement detection signal when the agreement is detected; and an output control circuit connected to the count control circuit, for controlling the transmission of the output pulse signal output from the variable delay element to following circuits of the variable delay element, based on the agreement detection signal generated by the count control circuit; wherein the loop control circuits comprises a second variable delay element having an input node and an output node, a second input pulse signal having a logic opposite to the logic of the first input pulse signal input into the input node of the first variable delay element being supplied to the input node of the second variable delay element; a flip-flop circuit having a set signal input node, a reset signal input node and an output node, the set signal input node of the flip-flop circuit being connected to the output node of the first variable delay element, and the reset signal input node of the flip-flop circuit being connected to the output node of the second variable delay element; and a feedback circuit for feeding back signal output from the output node of the flip-flop circuit to the input node of the first variable delay element; and wherein the first variable delay element, flip-flop circuit and feedback circuit form a ring oscillator and the ring oscillator is started by a predetermined input signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, embodiments of the present invention will be described in detail referring to drawings.

First, the outline of the variable delay element test circuit according to the present invention will be described.

The signal delay time from the input of signal into the input node of a variable delay element whose signal delay time is to be measured to the output of signal from the output node is set arbitrarily according to a control signal comprising a plurality of bits. Besides, the variable delay element is so constituted to realize $2^n$ kinds of mutually different delay times, supposing bit number of the control signal be n. Conventionally, expensive measuring instruments and considerable time were necessary for testing the performance of a variable delay element having the delay time variation amount of the order of several ps, because the variation amount among these multiple delay times is extremely small.

In the present invention, the variation amount of a delay time set by a variable delay element can be observed as the variation multiplied by an arbitrary multiple, by extracting signal passing through the variable delay element, after having passed through a loop circuit by a designated arbitrary number of times.

Here, the important point is that the signal delay time of a variable delay element is significant, if it is observed only at a determined-signal edge, namely either one of signal rising edge or dropping edge. The fine delay time difference can not be measured correctly by simply constituting a loop circuit, because it is the sum of delay times at both edges that will be observed. The present invention makes the observation possible by constituting the loop circuit under the condition of taking account of either one of edges.

Figure 1:
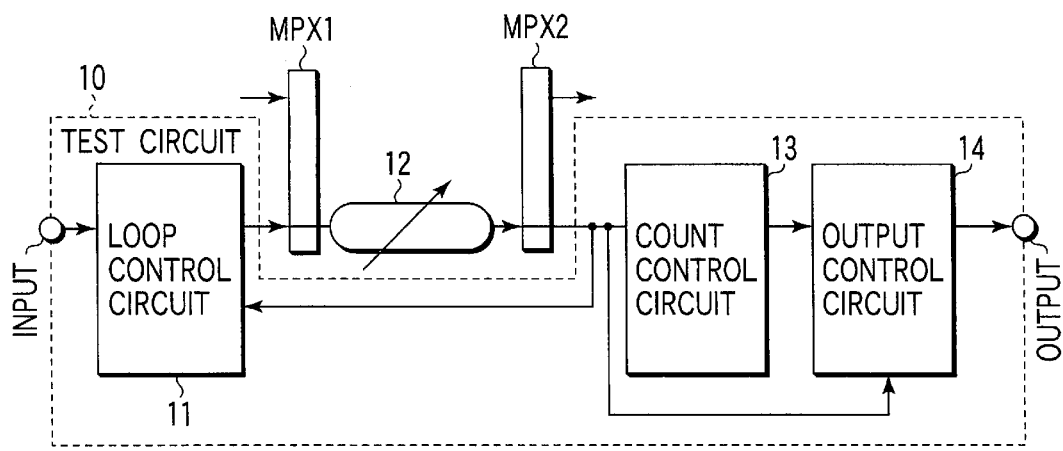
FIG. 1 is a block diagram showing variable delay element test circuit according to a first embodiment of the present invention.

FIG. 1 is a block diagram showing variable delay element test circuit according to a first embodiment of the present invention.

In this example, a test circuit 10 is also formed in a LSI where a variable delay element 12 is formed. The delay amount of the variable delay element 12 is set by a control signal (not shown) expressed for exampled by binary data. The variable delay element 12 is selectively connected to an ordinary signal circuit (not shown) and a test circuit 10 by a first multiplexer MPX1 disposed at its input side and a second multiplexer MPX2 disposed at the output side.

In the test circuit 10 of FIG. 1, a loop control circuit 11 receiving an input signal applied at an input node INPUT forms a loop circuit with the first multiplexer MPX1, the variable delay element 12 and the second multiplexer MPX2. Moreover, the test circuit 10 controls the input signal to the variable delay element 12 so that the positive/negative logic of the pulse signal applied to the variable delay element 12 is always constant, namely always the same edge such as only rising edge or only dropping edge.

A count control circuit 13 counts the number of passage (number of loop) of pulse signal through the variable delay element 12 by the loop circuit operation and, at the same time, compares this count value with a predetermined set value of number of loop, and generates an agreement detection signal when the agreement is detected.

The agreement detection signal generated in the count control circuit 13 and output pulse signal of the variable delay element 12 are input to the output control circuit 14. Then, the output control circuit 14 controls the output of the output pulse signal from the variable delay element 12 for the output node OUTPUT of the test circuit 10, according to the agreement detection signal.

Figure 2A:
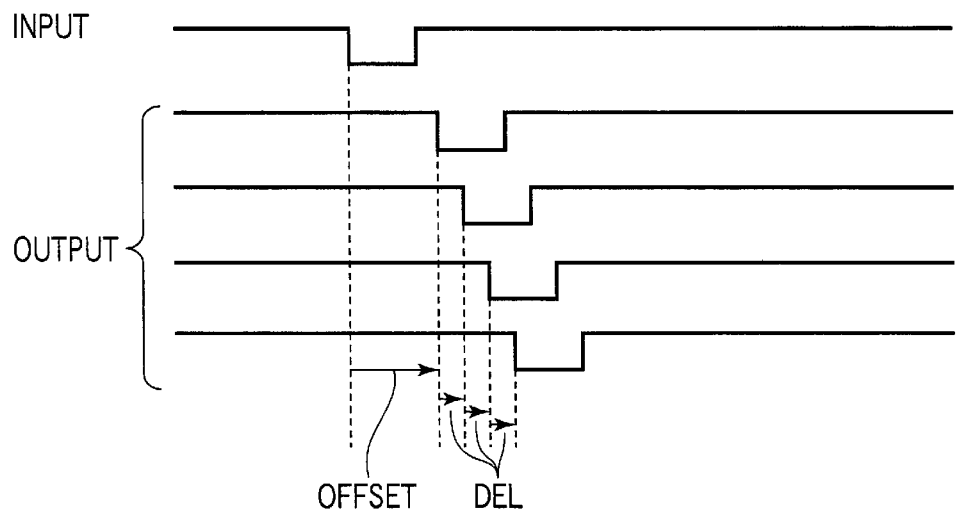
FIGS. 2A and 2B are timing charts showing different operation examples of the test circuit of FIG. 1.
Figure 2B:
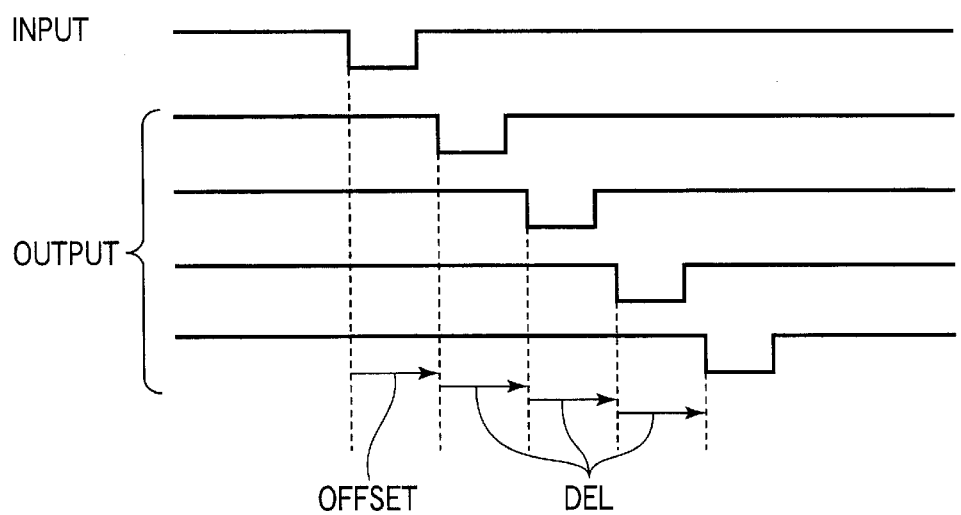

FIGS. 2A and 2B are timing charts showing mutually different operation examples of the test circuit 10 of FIG. 1. FIG. 2A shows an operation example where the set value of number of loop (stored value) is relatively small, while FIG. 2B shows an operation example where the set value of number of loop (stored value) is larger than the case of FIG. 2A.

Now, the operation example of the test circuit 10 of FIG. 1 will be described referring to FIGS. 2A and 2B.

FIG. 2A shows the output pulse signal timing of the output node OUTPUT with respect to the input impulse signal applied to the input node INPUT in the case where the set value of number of loop is relatively small.

Here, among output pulse signal of the output node OUTPUT, the signal of the highest grade is the signal timing of the case where the delaytime setting of the variable delay element 12 is controlled to the minimum value and has an offset delay OFFSET for the input pulse signal. The respective signals of lower grades are shown for the comparison of signal timing of the cases where the delay time setting of the variable delay element 12 is incremented by control signal 1LSB (LSB: Lowest Significant Bit) each time.

According to the operation example shown in FIG. 2A, the respective delay amount DEL of output pulse signal of the output node OUTPUT corresponding to the control signal variation by 1LSB is actually small.

On the other hand, FIG. 2B shows the output pulse signal timing of the output node OUTPUT with respect to the input impulse signal applied to the input node INPUT of the case where the set value of number of loop is relatively large.

Here, among output pulse signals of the output node OUTPUT, the signal of the highest grade is the signal timing of the case where the delay time setting of the variable delay element 12 is controlled to the minimum value and has the offset delay OFFSET for the input pulse signal as in the case of FIG. 2A. The respective signals of lower grades are shown for the comparison of signal timing of the cases where the delay time setting of the variable delay element 12 is incremented by control signal 1LSB each time.

According to the operation example shown in FIG. 2B, the respective delay amount DEL of output pulse signal of the output node OUTPUT corresponding to the control signal variation by 1LSB is large.

In other words, when the delay time difference of the variable delay element 12 corresponding to 1LSB variation of the control signal is to be measured, it can be observed by magnifying up to an observable range even if the actual delay time difference is minute, by extracting as output pulse signal after having passed through the same variable delay element 12 by multiple number of times as mentioned above.

Figure 3:
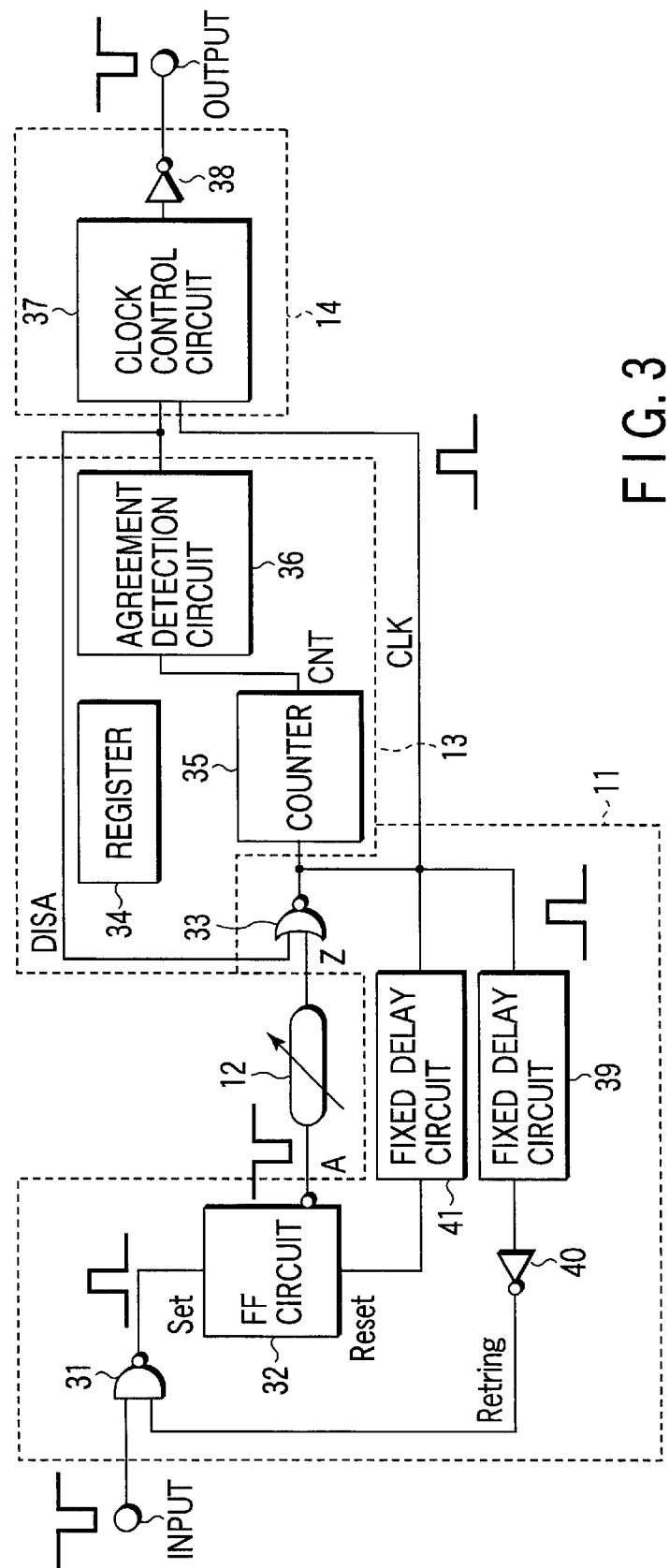
FIG. 3 is a circuit diagram showing a concrete configuration of the test circuit of FIG. 1.

FIG. 3 is a circuit diagram showing a concrete configuration of the test circuit 10 of FIG. 1.

In FIG. 3, a negative pulse is applied to the input node INPUT as input signal. The loop control circuit 11 comprises a 2-input NAND gate circuit 31 to input the input signal from the input node INPUT and the loop circuit feedback signal, a flip-flop (FF) circuit 32 whose set (Set) input is the output signal of this NAND gate circuit 31, a 2-input NOR gate circuit 33 whose one input node is supplied with the output pulse signal of this FF circuit 32 through the variable delay element 12, a first fixed delay circuit 39 to which the output pulse signal of this NOR gate circuit 33 is input and delayed by a constant time, a signal inversion circuit 40 for forming a feedback signal Retring by inverting the output signal of this first fixed delay circuit 39 and delivering to one input node of the NAND gate circuit 31, and a second fixed delay circuit 41 for inputting the output pulse signal from the NOR gate circuit 33, delaying this pulse signal by a constant time and delivering as reset (Reset) input of the FF circuit 32.

The loop circuit constituted of the NAND gate circuit 31, the FF circuit 32, the variable delay element 12, the NOR gate circuit 33, the first fixed delay circuit 39, and the signal inversion circuit 40 forms an oscillation circuit, and the pulse signal input to the variable delay element 12 will always have the same edge, dropping edge in this example.

The count control circuit 13 comprises a counter 35 to which the output signal CLK of the NOR gate circuit 33 is input as clock signal, a memory device, for example, a register 34, for storing data for setting number of passage of signal through the variable delay element 12, an agreement detection circuit 36 for detecting the agreement of the stored value data of this register 34 and the counted value data of the counter 35, and a signal line for delivering the output signal of the agreement detection circuit 36, namely agreement detection signal DISA, to the other input node of the NOR gate circuit 33.

The count control circuit 13 counts the number of passage (number of loop) of pulse signal through the variable delay element 12 by the loop circuit (oscillation circuit) operation and, at the same time, compares this count value with a previously stored set value of number of loop, and generates an agreement detection signal DISA when the agreement is detected, to control the following circuits.

The output control circuit 14 includes a clock control circuit 37 and a signal inversion circuit 38 for inverting output signal from this clock control circuit 37 and outputting to the output node OUTPUT of the test circuit. Then, agreement detection signal DISA generated by the agreement detection circuit 36 of the count control circuit 13, and the output signal CLK of the NOR gate circuit 33, namely signal that has passed through the variable delay element 12 are input to the clock control circuit 37. The clock control circuit 37 passes the clock signal CLK when the agreement detection signal DISA is "HI", and blocks the clock signal CLK when the agreement detection signal DISA is "L".

Now the operation outline of the test circuit of the aforementioned configuration shall be described.

In the loop circuit 11, negative pulse is generated by the FF circuit 32 using input pulse signal of negative pulse input from the input node INPUT as starting trigger, and applied to an input node A of the variable delay element 12. The negative pulse of output node Z that has passed through this variable delay element 12 is applied as clock of the counter 35 through the NOR gate circuit 33. The output signal CLK of this NOR gate circuit 33 is applied to the Rest input node of the FF circuit 32 through the second fixed delay circuit 41 to reset the FF circuit 32.

The output signal CLK of the NOR gate circuit 33 is delayed by the first fixed delay circuit 39 and then becomes feedback signal Retring through the signal inversion circuit 40, and the apply of this feedback signal Retring to the Set input node of the FF circuit 32 through the NAND gate circuit 31 sets the FF circuit 32, negative pulse is generated again, and input to the variable delay element 12.

As for the count control circuit 13, if the set value of the register 34 previously setting the number of passage of signal through the variable delay element 12 agrees with the count value CNT of the counter 35, agreement detection signal DISA is generated by the agreement detection circuit 36. Namely, the agreement detection signal DISA becomes activity level "H".

Then in the output control circuit 14, when the agreement detection signal DISA becomes activity level "H", the clock control circuit 37 passes the output signal CLK of the NOR gate circuit 33, inverts the passed signal by the signal inversion circuit 38 and outputs to the output node OUTPUT of the test circuit. The signal of this output node OUTPUT is observed by a measuring instrument connected to the LSI outside.

Figure 4A:
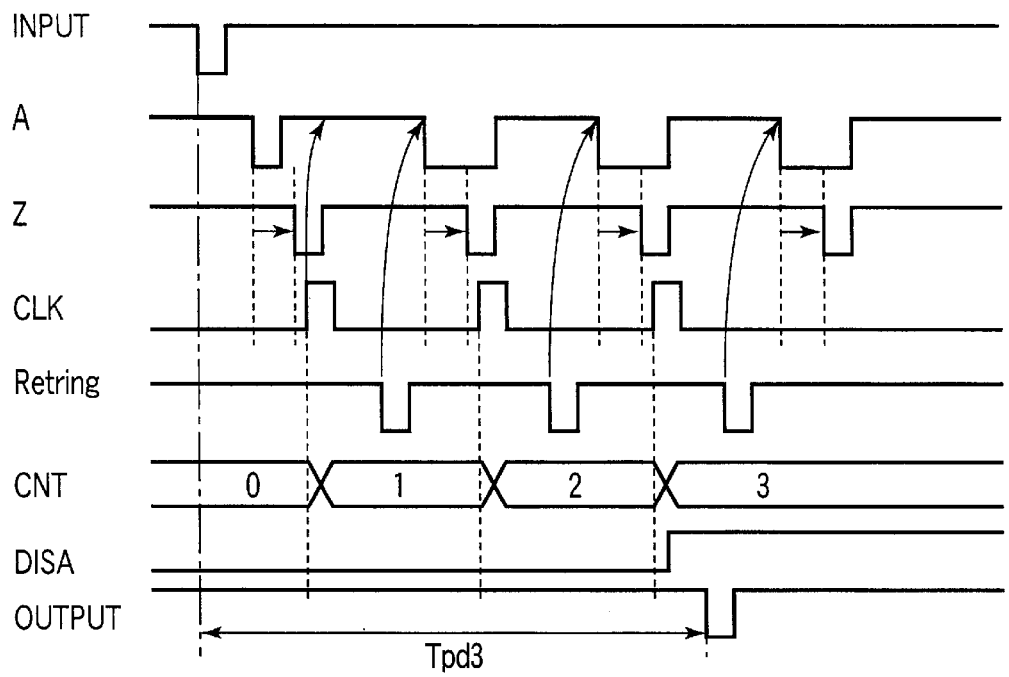
FIGS. 4A and 4B are timing charts showing different operation examples of the test circuit of FIG. 3.
Figure 4B:
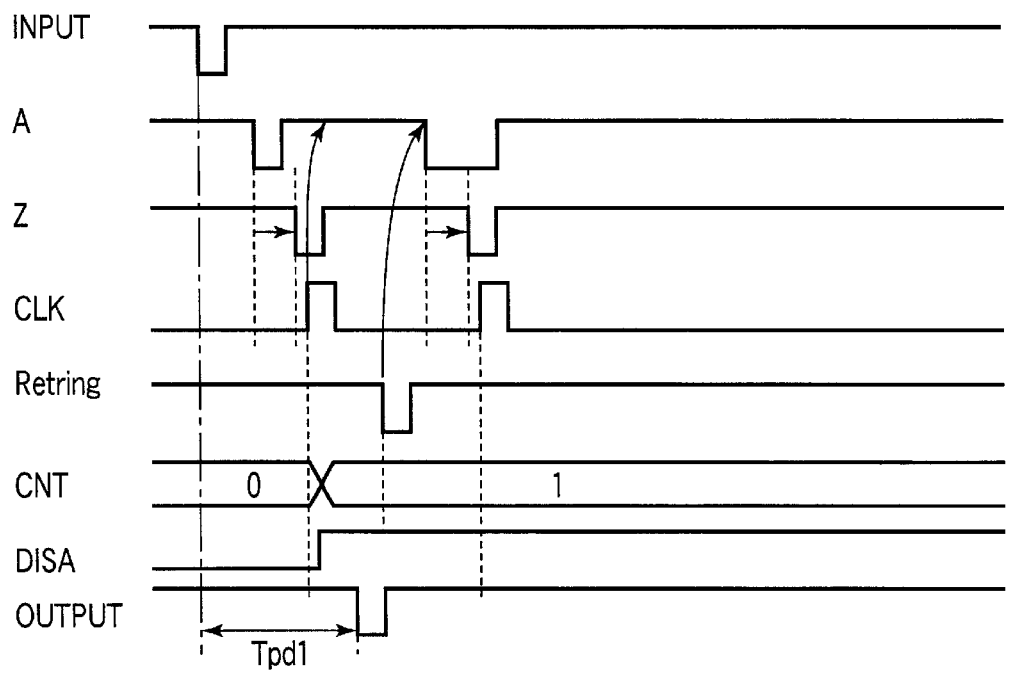

FIGS. 4A and 4B are timing charts showing the operation example of the case where the operation conditions of the test circuit of FIG. 3 are different. FIG. 4A shows an operation example in the case where the stored value of number of loop is set to a large value, while FIG. 4B shows an operation example in the case where the stored value of number of loop is set smaller than the case of FIG. 4A.

Now, the operation of the test circuit 10 of the aforementioned configuration will be described in detail referring to the timing chart shown in FIG. 4A.

When an input signal of a negative pulse form the input node INPUT is applied to one input node of the NAND gate circuit 31 and the signal level of the other input node of the NAND gate circuit 31 is "H", the NAND gate circuit 31 output a positive pulse signal. When this positive pulse signal is applied to the Set input node of the FF circuit 32, the output node of the FF circuit 32 outputs a negative pulse signal.

This negative pulse signal is input to the variable delay element 12, delayed by delay time set by the variable delay element 12, output from the output node Z of the variable delay element 12 and applied to one input node of the NOR gate circuit 33. Here, if the signal level of the other input node of the NOR gate circuit 33 is "L", a positive pulse signal CLK is output from this NOR gate circuit 33. This positive pulse signal CLK is input to the counter 35, and the count value of the counter 35 is incremented at the rising edge of the positive pulse signal CLK.

Thereafter, the positive pulse signal CLK is delayed by the second fixed delay circuit 41, the FF circuit 32 is reset by this delayed positive pulse signal CLK, and the signal of the output node of the FF circuit 32 returns to "H" level.

Besides, after the positive pulse signal CLK is delayed by first fixed delay circuit 39, it is inverted by the signal inversion circuit 40 and becomes a negative pulse signal Retring, and this negative pulse signal is applied to the other input node of the NAND gate circuit 31. Here, as "H" level of input node INPUT is applied to one input node of the NAND gate circuit 31, the negative pulse signal passes through the NAND gate circuit 31 and is applied to the Set input node of the FF circuit 32 as input node Set signal, and thereafter, the output node signal of the FF circuit 32 drops to "L" level again.

A repetition of the aforementioned loop operation increments the count value of the counter 35. And when the count value CNT of this counter 35 is incremented up to the set value of the register 34 (FIG. 4A is case "3" and FIG. 4B case "1"), the agreement detection circuit 36 detects the agreement and the agreement detection signal DISA becomes the activity level "H". At this moment, the NOR gate circuit 33 closes, the negative pulse signal that has passed through the variable delay element 12 does not pass the NOR gate circuit 33 and the increment operation of the counter 35 stops.

When the agreement detection signal DISA becomes "H", the clock control circuit 37 in the output control circuit 14 passes the output signal (positive pulse signal CLK) of the NOR gate circuit 33, this passed signal is inverted by the signal inversion circuit 38 and output to the output node OUTPUT.

In the aforementioned operation, for the case where the set value of the register 34 is "3" as shown in FIG. 4A and for the case where the set value of the register 34 is "1" as shown in FIG. 4B, the decomposition of the propagation delay time Tpd3 and Tpd1 is shown respectively by the following expressions (1), (2) from the apply of signal dropping edge to the input node INPUT respectively to the output of signal dropping edge to the output node OUTPUT.

$$Tpd3 = Tnd2r + Tfff + Tverf + Tnr2r + [Tdelr + Tivf + Tnd2r + Tfff + Tverf + Tnd2r] \times 3 + Tclkr + Tivf \quad (1)$$

$$Tpd1 = Tnd2r + Tfff + Tverf + Tnr2r + [Tdelr + Tivf + Tnd2r + Tfff + Tverf + Tnd2r] \times 1 + Tclkr + Tivf \quad (2)$$

where, Tnd2r represents the time from the apply of dropping edge as input signal to the NAND gate circuit 31 to the output of rising edge to the output, Tfff the time from the apply of rising edge as input signal to the FF circuit 32 to the output of dropping edge to the output, Tverf the time from the apply of dropping edge as input signal to the variable delay element 12 to the output of dropping edge to the output, Tnr2r the time from the apply of dropping edge as input signal to the NOR gate circuit 33 to the output of rising edge to the output, Tdelr the time from the apply of rising edge as input signal to the first fixed delay circuit 39 to the output of rising edge to the output, Tivf the time from each apply of rising edge as input signal to the signal inversion circuit 40, 38 to the output of dropping edge to the output, and Tclkr the time from the apply of rising edge as input signal to the clock control circuit 37 to the output of rising edge to the output, respectively.

On the other hand, the propagation delay time Tpd3', Tpd1' of the case where the variable delay element 12 delay time setting is changed to Tverf' are expressed by the (1) and (2) where Tverf is substituted by Tverf'.

Consequently, when the set value of the register 34 is set to "1", it will be observed as Tpd1'−Tpd1=Tverf'−Tverf at the output node OUTPUT.

On the other hand, when the set value of the register 34 is set to "3", it makes Tpd3'−Tpd3=Tverf'×3−Tverf×3=(Tverf'−Tverf)×3, and the delay time variation will be observed magnified by 3 compared to the case where the set value of the register 34 is set to "1".

Next, logical simulation results of the aforementioned test circuit operation are shown in Table 1.

TABLE 1

| Reg | VER delay data: #000 | | | VER delay data: #001 | | | Tpd1− | |
| --- | --- | --- | --- | --- | --- | --- | --- | --- |
| data | Input time | Output time | Tpd0 | Input time | Output time | Tpd1 | Tpd0 | Magnitude |
| 1 | 5100.00 | 5114.24 | 14.24 | 5100.00 | 5114.28 | 14.28 | 0.04 | Reference |
| 2 | 6300.00 | 6323.76 | 23.76 | 6300.00 | 6323.84 | 23.84 | 0.08 | 2 |
| 3 | 7500.00 | 7533.28 | 33.28 | 7500.00 | 7533.40 | 33.40 | 0.12 | 3 |

TABLE 1-continued

| Reg data | VER delay data: #000 | | | VER delay data: #001 | | | Tpd1−Tpd0 | Magnitude |
|---|---|---|---|---|---|---|---|---|
| | Input time | Output time | Tpd0 | Input time | Output time | Tpd1 | | |
| 4  | 8700.00  | 8742.8   | 42.80  | 8700.00  | 8742.96  | 42.96  | 0.16 | 4  |
| 5  | 9900.00  | 9952.32  | 52.32  | 9900.00  | 9952.52  | 52.52  | 0.20 | 5  |
| 6  | 11100.00 | 11161.84 | 61.84  | 11100.00 | 11162.08 | 62.08  | 0.24 | 6  |
| 7  | 12300.00 | 12371.36 | 71.36  | 12300.00 | 12371.64 | 71.64  | 0.28 | 7  |
| 8  | 13500.00 | 13580.88 | 80.88  | 13500.00 | 13581.20 | 81.20  | 0.32 | 8  |
| 9  | 14700.00 | 14790.4  | 90.40  | 14700.00 | 14790.76 | 90.76  | 0.36 | 9  |
| 10 | 15900.00 | 15999.92 | 99.92  | 15900.00 | 16000.32 | 100.32 | 0.40 | 10 |
| 11 | 17100.00 | 17209.44 | 109.44 | 17100.00 | 17209.88 | 109.88 | 0.44 | 11 |
| 12 | 18300.00 | 18418.96 | 118.96 | 18300.00 | 18419.44 | 119.44 | 0.48 | 12 |
| 13 | 19500.00 | 19628.48 | 128.48 | 19500.00 | 19629.00 | 129.00 | 0.52 | 13 |
| 14 | 20700.00 | 20838    | 138.00 | 20700.00 | 20838.56 | 138.56 | 0.56 | 14 |
| 15 | 21900.00 | 22047.52 | 147.52 | 21900.00 | 22048.12 | 148.12 | 0.60 | 15 |
| 16 | 23100.00 | 23257.04 | 157.04 | 23100.00 | 23257.68 | 157.68 | 0.64 | 16 |
| 17 | 24300.00 | 24466.56 | 166.56 | 24300.00 | 24467.24 | 167.24 | 0.68 | 17 |
| 18 | 25500.00 | 25676.08 | 176.08 | 25500.00 | 25676.80 | 176.80 | 0.72 | 18 |
| 19 | 26700.00 | 26885.6  | 185.60 | 26700.00 | 26886.36 | 186.36 | 0.76 | 19 |
| 20 | 27900.00 | 28095.12 | 195.12 | 27900.00 | 28095.92 | 195.92 | 0.80 | 20 |
| 21 | 29100.00 | 29304.64 | 204.64 | 29100.00 | 29305.48 | 205.48 | 0.84 | 21 |
| 22 | 30300.00 | 30514.16 | 214.16 | 30300.00 | 30515.04 | 215.04 | 0.88 | 22 |
| 23 | 31500.00 | 31723.68 | 223.68 | 31500.00 | 31724.60 | 224.60 | 0.92 | 23 |
| 24 | 32700.00 | 32933.2  | 233.20 | 32700.00 | 32934.16 | 234.16 | 0.96 | 24 |
| 25 | 33900.00 | 34142.72 | 242.72 | 33900.00 | 34143.72 | 243.72 | 1.00 | 25 |
| 26 | 35100.00 | 35352.24 | 252.24 | 35100.00 | 35353.28 | 253.28 | 1.04 | 26 |
| 27 | 36300.00 | 36561.76 | 261.76 | 36300.00 | 36562.84 | 262.84 | 1.08 | 27 |
| 28 | 37500.00 | 37771.28 | 271.28 | 37500.00 | 37772.40 | 272.40 | 1.12 | 28 |
| 29 | 38700.00 | 38980.8  | 280.80 | 38700.00 | 38981.96 | 281.96 | 1.16 | 29 |
| 30 | 39900.00 | 40190.32 | 290.32 | 39900.00 | 40191.52 | 291.52 | 1.20 | 30 |
| 31 | 41100.00 | 41399.84 | 299.84 | 41100.00 | 41401.08 | 301.08 | 1.24 | 31 |

Here, Reg data in Table 1 is a set value of the register 34, Tpd0 is a propagation delay time of the case where delay set data of variable delay element 12 is #000(=0), Tpd1 is a propagation delay time of the case where delay set data of variable delay element 12 is #001(=1), and the magnitude is a ratio taking Tpd1−Tpd0 of the case where Reg data is 1 as reference.

According to Table 1, in the test circuit of this example, it is confirmed that a signal whose delay time variation amount is magnified by the set value of the register 34 is output to the output node OUTPUT. Moreover, as shown by the aforementioned expressions (1), (2), the delay time taking account of the dropping edge of the signal passing through the variable delay element 12 can be extracted.

Figure 5:
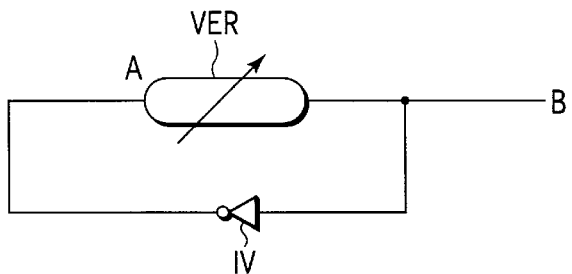
FIG. 5 is a circuit diagram of a test circuit constituting a ring oscillator by loop connection of a variable delay element and an inverter circuit.
Figure 6:
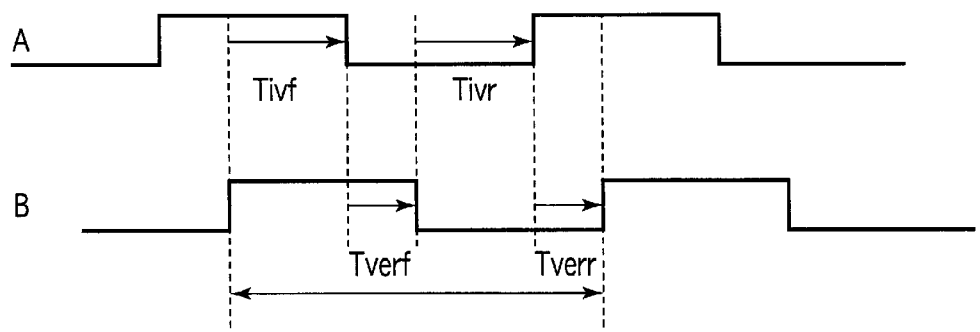
FIG. 6 is a timing chart showing an operation example of the test circuit of FIG. 5.

Here, for comparison, the operation of a ring oscillator constituted by loop connection of a variable delay element VER and an signal inversion circuit IV as shown in FIG. 5 will be described using the timing chart shown in FIG. 6.

Suppose an input node of the variable delay element VER be A, the output node B, the propagation delay time from the apply of signal rising edge of the output node of the variable delay element VER as input signal to the signal inversion circuit IV to the output of dropping edge is designated as Tivf, the propagation delay time from the apply of signal dropping edge as input signal to the variable delay element VER to the output of dropping edge is designated as Tverf, the propagation delay time from the apply of signal dropping edge as input signal to the signal inversion circuit IV to the output of rising edge is designated as Tivr, and the propagation delay time from the apply of signal rising edge as input signal to the variable delay element VER to the output of rising edge to the output node B is designated as Tverr, the signal cycle of the output node B can be expressed by the following (3).

$$Tverr+Tivf+Tverf+Tivf \quad (3)$$

As obvious from the expression (3) above, in the test circuit of FIG. 5, rising edge and dropping edge of signal passing through the variable delay element VER are intermixed, and it is impossible to extract the delay time taking account of one of signal rising edge or dropping edge.

Figure 7:
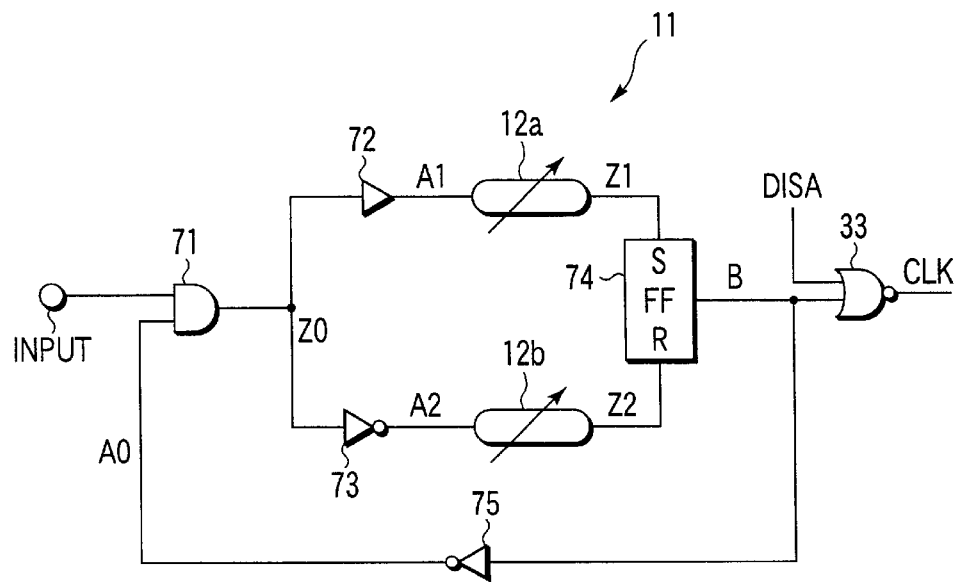
FIG. 7 is a circuit diagram showing the configuration of a part of a test circuit according to a second embodiment of the present invention.

FIG. 7 is a circuit diagram showing a concrete configuration of the loop control circuit 11 according to a second embodiment of the present invention. Though the count control circuit 13 and the output control circuit 14 shown in FIG. 3 above are not illustrated in FIG. 7, it is evident that they are installed as in FIG. 3.

In FIG. 7, 71 designates a 2-input AND gate circuit for oscillation control to which input signal from the input node INPUT and the feedback of the loop circuit signal are input. Signal of the output node Z0 of this AND gate circuit 71 is input to an input node A1 of a first variable delay element 12a trough a buffer circuit 72 and, at the same time, to an input node A2 of a second variable delay element 12b through a inversion buffer circuit 73. In a FF circuit 74 for waveform correction, output signal from an output node Z1 of the first variable delay element 12a is input to a set signal input node S and output signal from an output node Z2 of the second variable delay element 12b is input to a reset signal input node R.

Signal form the output node B of the FF circuit 74 is supplied to one input node of the NOR gate circuit 33, inverted by the signal inversion circuit 75 and input as feedback signal to the other input node A0 of the AND gate circuit 71.

Besides, agreement detection signal DISA output from the count control circuit 13 shown in FIG. 3 is input to the other input node of the NOR gate circuit 33, and output of the NOR gate circuit 33 is input to the counter 35 in the count control circuit 13 as the case shown in FIG. 3.

In the aforementioned configuration, a loop circuit comprising the AND gate circuit 71 for oscillation control, the normal rotation buffer circuit 72, the first variable delay element 12a, the FF circuit 74 for waveform correction and the signal inversion circuit 75 forms an ring oscillator. And, significant edge of signal applied to the first variable delay element 12a becomes rising edge, while significant edge of signal applied to the second variable delay element 12b becomes dropping edge.

Figure 8:
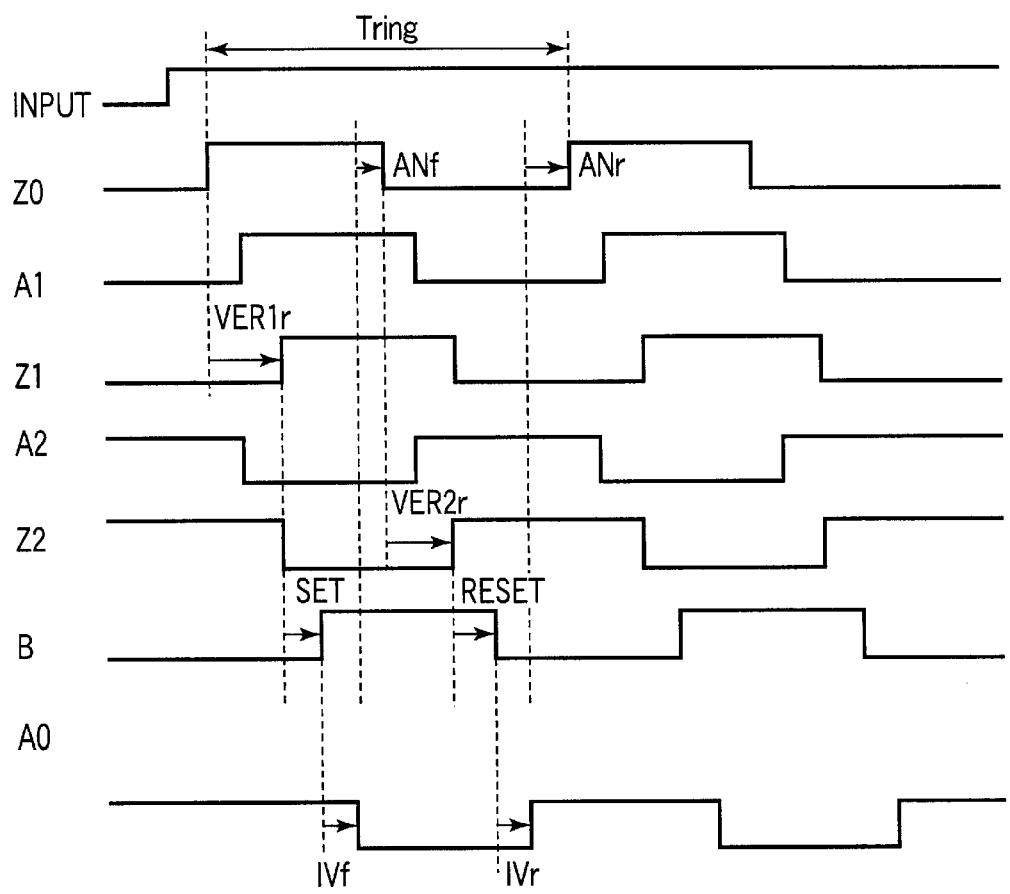
FIG. 8 is a timing chart showing an operation example of the test circuit of FIG. 7.

FIG. 8 is a timing chart showing an operation example of the test circuit of FIG. 7.

If an input signal to the input node INPUT becomes "H"level, signal at the output node Z0 of the comprising AND gate circuit 71 for oscillation control become "H" level, and the oscillation of the ring oscillator starts at the cycle Tring taking this node Z0 positive pulse signal as starting trigger.

The brake down of the cycle Tring is shown by the following expression (4).

$$Tring = VER1r + SET + IVf + ANf + VER2r + RESET + IVr + ANr \quad (4)$$

Here, VER1r represents the time of passage of signal rising edge in the first variable delay element 12a, SET time from apply of signal rising edge to the Set signal input node of the FF circuit 74 to the output of rising signal at the output node, IVf time from apply of signal rising edge as input signal to the signal inversion circuit 75 to the drop of output signal, ANf time of passage of signal dropping edge in the AND gate circuit 71, VER2r time of passage of signal rising edge in the second variable delay element 12b, RESET time from apply of signal rising edge as input signal to the Reset signal input node of the FF circuit 74 to the output of dropping edge at the output node, IVr time from apply of dropping signal as input signal to the signal inversion circuit 75 to the output rising, and ANr time of passage of rising edge in the AND gate circuit.

What are important in the time breakdown shown in the aforementioned expression (4) are the time VER1r of passage of signal rising edge in the first variable delay element 12a and the time VER2r of passage of signal rising edge in the second variable delay element 12b. The effect of the time of passage of signal rising edge in the first and second variable delay element 12a, 12b is the point that does not affect the oscillation signal observed at the output node of the FF circuit 74.

When the time delay is actually measured using the loop control circuit 11 shown in FIG. 7, the count control circuit 13 and output control circuit 14 are installed in the following steps of the NOR gate circuit 33 as in the first embodiment, the delay time setting in the first variable delay circuit 12a and second variable delay circuit 12b is changed, the oscillation control is performed by the signal level control of the input node INPUT, and the delay time variation of the first variable delay circuit 12a and second variable delay circuit 12b is measured respectively by a measuring instrument connected to the exterior.

According to the test circuit of FIG. 7, the configuration can be more simplified than the test circuit of FIG. 3 by using the variable delay element 12a to which signal rising edge is applied and the variable delay element 12b to which signal dropping edge is applied.

Figure 9:
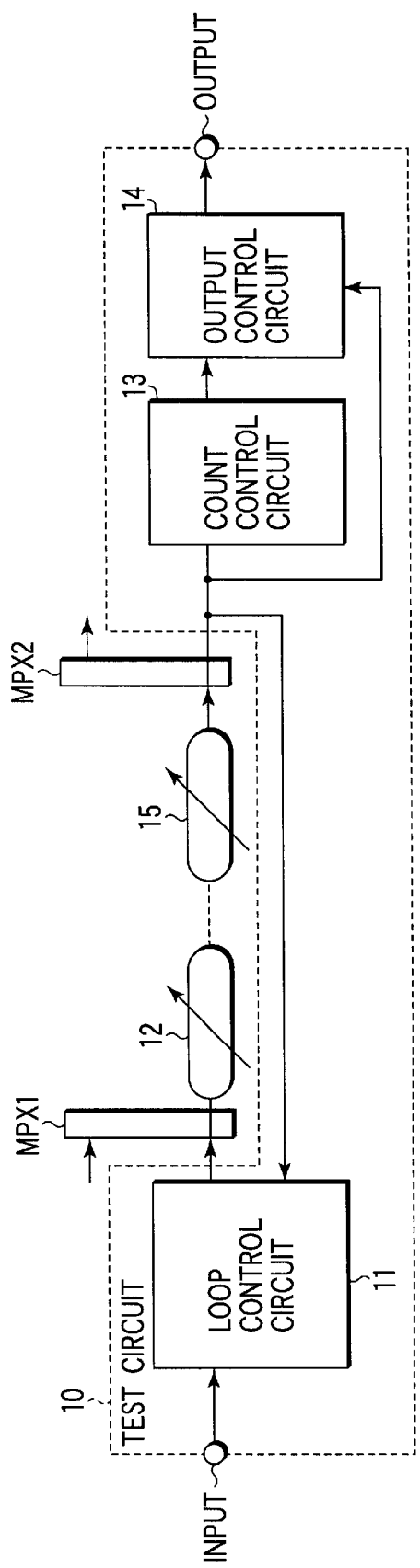
FIG. 9 is a circuit diagram showing the configuration of a test circuit according to a third embodiment of the present invention.

By the way, though the test circuit was connected to one variable delay element 12 in the first embodiment shown in FIG. 1, the test circuit may well be connected to those in such state that one or more other delay element 15 in the same LSI are connected in series to the variable delay element 12 to be measured, as shown in FIG. 9, to perform the test similarly as the embodiment. This case is effective, because a plurality of variable delay elements can be tested by the same test circuit. The other delay element 15 may be variable delay element or fixed delay circuit.

Besides, though, in the aforementioned respective embodiment, it has been described about the case where the test can be executed during LSI chip production stage or in use state after delivery, by integrating the test circuit in the same LSI as the variable delay element to be measured, it is not-restrictive, and the test circuit may be constituted on a printed circuit board other than LSI. In this case, the advantage will consist in a large universality of the test circuit itself.

As mentioned above, the present invention allows to measure a minute delay time variation amount with a high accuracy even when the variable delay element delay time variation amount is extremely small, and to decide success or failure of variable delay element rapidly and with a high accuracy.

In other words, success or failure can be decided with the conventional measuring environment, by magnifying a minute delay time.

It is also effective for the case where a single variable delay element is to be measured or it is difficult to constitute a test circuit by combining a plurality of them.

Moreover, the test circuit configuration can be simplified by using a plurality of variable delay element.

If the test circuit is built in the same LSI as the variable delay element, the test can be executed both during LSI chip production stage or in use state after delivery.

In addition to LSI inside, the test circuit can also be constituted on a printed circuit board and, a test circuit of large universality can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A variable delay element test circuit comprising:

a variable delay element having an input node and an output node, a delay time amount to output by delaying an input pulse signal input to the input node is set arbitrarily;

a loop control circuit having a loop circuit, said variable delay element being included in this loop circuit, for controlling so that the positive/negative logic of said input pulse signal input to the input node of said variable delay element is always constant;

a count control circuit for receiving an output pulse signal output from the output node of said variable delay element, counting the number of receptions of this output pulse signal, detecting agreement of that count value and a predetermined set value, and for generating an agreement detection signal when the agreement is detected; and an output control circuit connected to said count control circuit for controlling the transmission of said output pulse signal output from said variable delay element to following circuits of said variable delay element, based on the agreement detection signal generated by said count control circuit.

2. The circuit according to claim 1, wherein said loop control circuit comprises:

a flip-flop circuit including a set signal input node, a reset signal input node and an output node, the output node of said flip-flop circuit being connected to the input node of said variable delay element;

a first fixed delay element for receiving and delaying said output pulse signal from the output node of said variable delay element, and delivering as set signal to said set signal input node of said flip-flop circuit; and a second fixed delay element for receiving and delaying said output pulse signal from the output node of said variable delay element, and delivering as reset signal to said reset signal input node of said flip-flop circuit; and wherein said loop control circuit being started by a predetermined input pulse signal and said loop circuit being closed based on said agreement detection signal.

3. The circuit according to claim 1, further comprising another delay element connected in series with said variable delay element.

4. The circuit according to claim 3, wherein said another delay element is a variable delay element.

5. The circuit according to claim 1, wherein said loop control circuit includes:

a NAND gate circuit having first and second input nodes and an output node, a predetermined input pulse signal being supplied to the first input node thereof;

a flip-flop circuit including a set signal input node, a reset signal input node and an output node, the output node of said NAND gate circuit being connected to the set signal input node and the input node of said variable delay element being connected to the output node of said flip-flop circuit;

a NOR gate circuit having a first and second input nodes and an output node, the first input node being connected to the output node of said variable delay element, said agreement detection signal being supplied to the second input node thereof;

a a first fixed delay element having an input node and an output node, the input node being connected to the output node of said NOR gate circuit, and the output node being connected to the reset signal input of said flip-flop circuit;

a second fixed delay element having an input node and an output node, the input node being connected to the output node of said NOR gate circuit; and a signal inversion circuit having an input node and an output node, the input node being connected to the output node of said second fixed delay element, and the output node being connected to the second input node of said NAND gate circuit.

6. The circuit according to claim 1, wherein said loop control circuit, count control circuit and output control circuit are formed on a same semiconductor integrated circuit as said variable delay element.

7. The circuit according to claim 1, wherein said loop control circuit, count control circuit and output control circuit are formed outside a semiconductor integrated circuit where said variable delay element is formed.

8. A variable delay element test circuit comprising:

a first variable delay element having an input node and an output node, a delay time amount to output by delaying a first input pulse signal input to the input node being set arbitrarily;

a loop control circuit having a loop circuit, said first variable delay element being included in this loop circuit, for controlling so that the positive/negative logic of said first input pulse signal input to the input node of said first variable delay element is always constant;

a count control circuit for receiving an output pulse signal output from the output node of said first variable delay element, counting the number of receptions of this output pulse signal, detecting agreement of that count value and a predetermined set value, and for generating an agreement detection signal when the agreement is detected; and an output control circuit connected to said count control circuit for controlling the transmission of said output pulse signal output from said variable delay element to following circuits of said variable delay element, based on the agreement detection signal generated by said count control circuit;

wherein said loop control circuits comprises:

a second variable delay element having an input node and an output node, a second input pulse signal having a logic opposite to the logic of said first input pulse signal input into the input node of said first variable delay element being supplied to the input node of said second variable delay element;

a flip-flop circuit having a set signal input node, a reset signal input node and an output node, the set signal input node of said flip-flop circuit being connected to the output node of said first variable delay element, and the reset signal input node of said flip-flop circuit being connected to the output node of said second variable delay element; and a feedback circuit for feed backing signal output from said output node of said flip-flop circuit to the input node of said first variable delay element; and wherein said first variable delay element, flip-flop circuit and feedback circuit form a ring oscillator and said ring oscillator is started by a predetermined input signal.

9. The circuit according to claim 8, wherein said feedback circuit comprises:

a signal inversion circuit having an input node and an output node, the input node being connected to the output node of said flip-flop circuit;

an AND gate circuit having first and second input nodes and an output node, a predetermined input pulse signal being supplied to the first input node thereof, and the second input node being connected to the output node of said signal inversion circuit; and a buffer circuit having an input node and an output node, the input node of said buffer circuit being connected to the output node of said AND gate circuit, and the output node of said buffer circuit is connected to the input node of said first variable delay element.

10. The circuit according to claim 8, wherein said loop control circuit, count control circuit and output control circuit are formed on a same semiconductor integrated circuit as said first and second variable delay elements.

11. The circuit according to claim 8, wherein said loop control circuit, count control circuit and output control circuit are formed outside a semiconductor integrated circuit where said first and second variable delay elements are formed.

* * * * *